US008679591B2

(12) United States Patent
Hwang et al.

(10) Patent No.: US 8,679,591 B2
(45) Date of Patent: Mar. 25, 2014

(54) METHOD FOR REDUCING VOIDS IN A COPPER-TIN INTERFACE AND STRUCTURE FORMED THEREBY

(75) Inventors: Chien Ling Hwang, Hsin-Chu (TW); Yi-Li Hsiao, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 193 days.

(21) Appl. No.: 12/891,487

(22) Filed: Sep. 27, 2010

(65) Prior Publication Data
US 2011/0115077 A1 May 19, 2011

Related U.S. Application Data

(60) Provisional application No. 61/262,021, filed on Nov. 17, 2009.

(51) Int. Cl.
*B05D 1/18* (2006.01)

(52) U.S. Cl.
USPC ........... 427/436; 257/734; 257/772; 257/779; 257/780; 257/E21.508; 257/E21.509; 438/616; 438/617; 438/678; 228/36; 228/56.3; 228/178; 228/179.1; 228/180.22; 427/97.7; 427/99.5; 427/304; 427/305; 427/169; 427/498; 427/433; 427/435; 427/312; 427/313; 427/512; 427/594; 427/318; 427/319; 427/126.1

(58) Field of Classification Search
USPC ............... 257/734, 772, 779, 780, E21.508, 257/E21.509; 438/616, 617, FOR. 390, 678; 228/36, 56.3, 178, 179.1, 180.22; 427/97.7, 99.5, 304, 305, 169, 430, 427/433, 435, 436, 312, 313, 498, 512, 594, 427/FOR. 107, 318, 319, 126.1, 443.1
See application file for complete search history.

(56) References Cited

U.S. PATENT DOCUMENTS

| | | | | |
|---|---|---|---|---|
| 5,518,964 | A * | 5/1996 | DiStefano et al. | 438/113 |
| 2002/0064676 | A1* | 5/2002 | Bokisa et al. | 428/645 |
| 2008/0173550 | A1* | 7/2008 | Kiso et al. | 205/253 |
| 2011/0097577 | A1* | 4/2011 | Soliman et al. | 428/339 |

FOREIGN PATENT DOCUMENTS

| | | |
|---|---|---|
| TW | 200924064 A | 6/2009 |
| TW | 200939368 A | 9/2009 |
| TW | M368273 U | 11/2009 |

* cited by examiner

*Primary Examiner* — Meiya Li
(74) *Attorney, Agent, or Firm* — Slater & Matsil, L.L.P.

(57) ABSTRACT

An embodiment is a method for forming a semiconductor assembly including cleaning a connector including copper formed on a substrate, applying cold tin to the connector, applying hot tin to the connector, and spin rinsing and drying the connector.

20 Claims, 3 Drawing Sheets

US 8,679,591 B2

METHOD FOR REDUCING VOIDS IN A COPPER-TIN INTERFACE AND STRUCTURE FORMED THEREBY

This application claims the benefit of U.S. Provisional Patent Application Ser. No. 61/262,021 filed on Nov. 17, 2009, and entitled "Method for Reducing Voids in a Copper-Tin Interface and Structure Formed Thereby," which application is incorporated herein by reference.

TECHNICAL FIELD

The disclosure relates generally to a method for semiconductor assembly processing and the semiconductor assembly formed thereby, and more particularly to a method for reducing voids in a copper-tin interface in the semiconductor assembly and the semiconductor assembly formed thereby.

BACKGROUND

As semiconductor devices continually decrease in size, the use of flip chip assemblies generally gains in popularity. Flip chip assemblies are semiconductor chips, or integrated circuits, that have external electrical pads on a surface of the chip to which solder pillars or bumps are connected. The pillars or bumps are then connected to a substrate or carrier using a soldering process. The pillars or bumps create a physical and electrical connection between the substrate and the chip. Further, generally an underfill is used to fill the space between substrate and the chip and around the pillars or bumps to give the flip chip assembly more mechanical strength.

The pillars or bumps typically comprise copper, although many forms of solder may be used. Further, the pillars or bumps are generally coated or immersed in tin to protect the bumps from external factors, such as corrosion, as well as to aid in the soldering process. However, by immersing the pillars or bumps in tin, voids may randomly occur at the interface between the copper in the pillar or bump and the tin. The voids may be generally around 200 nanometers wide. The voids may lead to weakened mechanical strength of the connection, may cause delamination of a semiconductor chip, and may lead to cracks in the pillars or bumps that can cause open electrical circuits.

The cause of the voids is not readily apparent. One theorized cause is that the presence of copper oxide or irregularities at the copper-tin interface prevents tin from reacting or bonding to the copper and forms irregular voids. Also, by depositing tin at a high temperature onto the copper, the reaction between the copper and the tin may cause lateral shear stresses that can cause the voids.

SUMMARY

In accordance with an embodiment, a method for forming a semiconductor assembly comprises cleaning a connector comprising copper formed on a substrate, applying cold tin to the connector, applying hot tin to the connector, and spin rinsing and drying the connector.

In accordance with another embodiment, a method for forming a semiconductor assembly comprises pre-cleaning a surface of a copper connector, immersing the surface of the copper connector into a thermal gradient of tin, and spin rinsing and drying the copper connector. The thermal gradient of tin comprises a cold tin immersion and a subsequent hot tin immersion.

In accordance with another embodiment, a semiconductor assembly comprises a semiconductor chip, a pad on the semiconductor chip, a copper connector physically coupled to the pad, and a copper-tin compound layer on a surface of the copper connector. An interface between the copper-tin compound layer and the copper connector is free of voids larger than 100 nanometers in width.

In accordance with a further embodiment, a semiconductor chip comprises a copper connector, a copper-tin compound layer, a first tin layer, and a second tin layer. The copper-tin compound layer is on an exterior surface of the copper connector, and the exterior surface of the copper connector is free of voids greater than 100 nanometers in width. The first tin layer on the copper-tin compound layer, and the second tin layer on the first tin layer.

BRIEF DESCRIPTION OF THE DRAWINGS

For a more complete understanding of embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Some embodiments will be described with respect to a specific context, namely a flip chip assembly. Other embodiments may also include, however, other applications using similar techniques to bond or solder an assembly.

Figure 1:
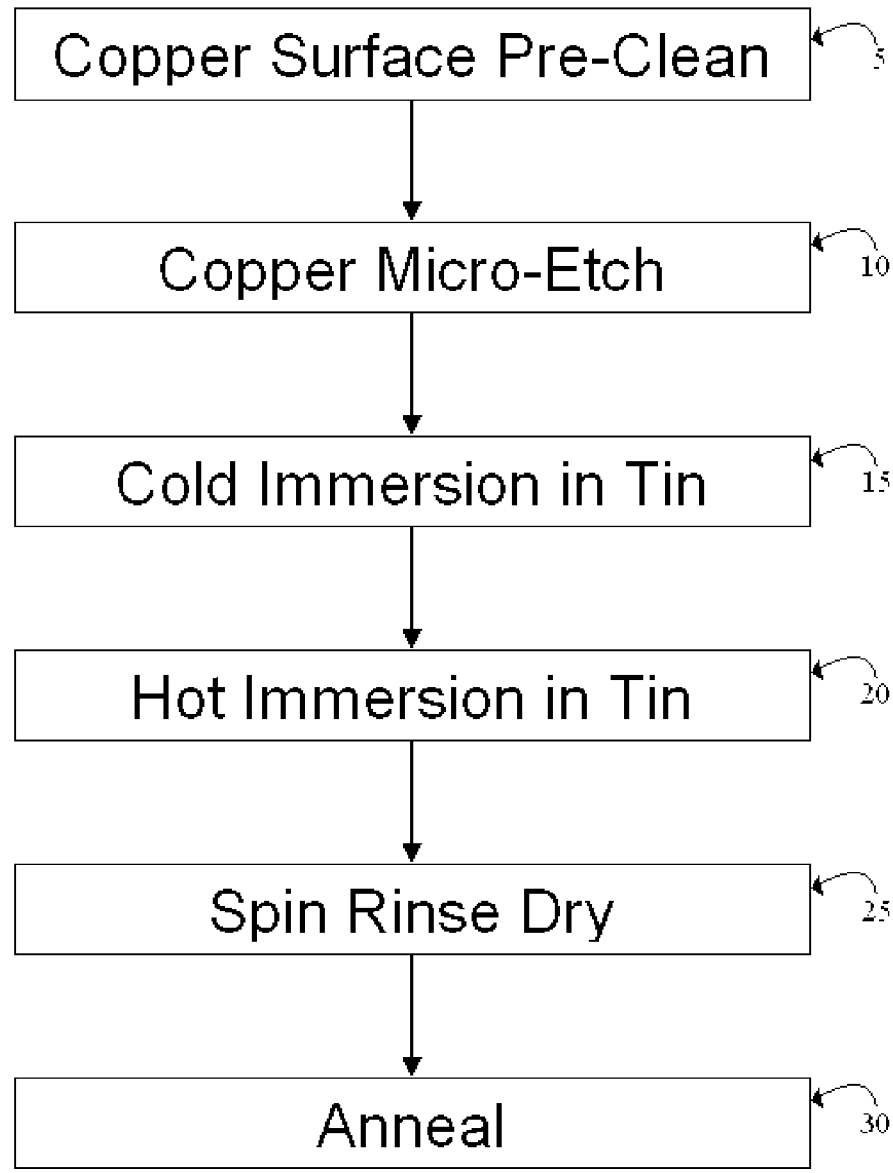
FIG. 1 is a flow chart of process in accordance with an embodiment.

FIG. 1 shows a process in accordance with an embodiment. At the outset, it is assumed that a connector, such as a pillar or bump, is provided comprising copper. This pillar or bump may be applied directly on an electrical pad on a semiconductor chip for a flip chip assembly or other similar application. At step 5, the surface of the copper pillar or bump is pre-cleaned. The pre-clean may be performed by using dilute sulfuric acid ($H_2SO_4$) or other suitable chemicals. The pre-clean may be performed by immersing the surface of a wafer or semiconductor chip on which the pillar or bump is applied into a bath of sulfuric acid or other chemical. Also, the pre-clean may be performed by immersing a batch of wafers vertically into a tank of sulfuric acid or other chemical. The purpose of the pre-clean is to clean the copper surface and remove any copper oxide that may have formed on the surface of the copper. Further, the pre-clean is used to wet the copper surface to aid in preventing voids between the future copper-tin interface.

At step 10, an optional micro-etch is performed on the pillar or bump. The micro-etch is performed to ensure that substantially all of the copper oxide is removed from the surface of the pillar or bump. The micro-etch may be performed using sodium persulfate, sulfuric acid, combinations thereof, or the like.

At step 15, the pillar or bump is immersed into cold tin as a pre-dip. The immersion may be performed by immersing the surface of the wafer or semiconductor chip on which the pillar or bump is applied into a bath of tin that is at or near room temperature, or in other words, between about 20° C. and about 25° C. Also, the immersion may be performed by immersing a batch of wafers vertically into a tank of cold tin. The cold tin may be mixed with a reducing agent, such as thiourea to form a thiourea mixture, to decrease the reaction potential between the copper and tin and to increase chemical reactions.

At step 20, the pillar or bump is immersed into hot tin as a bulk deposition. The immersion may be performed by immersing the pillar or bump into a bath of tin that is between about 40° C. and about 75° C. Further, the immersion may be performed by immersing a batch of wafers vertically into a tank of hot tin. The hot tin may be mixed with a reducing agent, such as thiourea to form a thiourea mixture, to decrease the reaction potential between the copper.

By performing the immersions at two different thermal levels, stress created by the chemical reaction between the copper and tin may be released or reduced. For example, at a lower temperature and lower deposition rate, tin atoms have lower bonding energy such that each tin atom is less likely to form a bond with multiple copper atoms, as opposed to when tin is deposited at high temperatures. This avoids the lateral shear force that may occur at the interface between the copper and the copper-tin compound because the tin deposited on the copper is denser such that less stress exists in the copper-tin interface. Then, tin may be deposited at a higher temperature and higher deposition rate onto the previously deposited cold tin. No significant interface stress exists between the cold tin and the hot tin. Therefore, this thermal gradient may help to prevent the formation of voids at the copper-tin interface.

At step 25, a spin rinse dry step is performed to remove excess tin from the pillar or bump and the wafer or semiconductor chip and to dry the reacted copper and tin. The spin rinse dry step may be performed by spinning a wafer and spraying water on the wafer. Then, a nitrogen flow may be applied to the top of the wafer to avoid a water mark residue on the wafer. At step 30, an optional anneal step is performed to further react the tin with the copper. The anneal may be performed in an environment with a temperature between about 100° C. and about 250° C., but generally around 150° C. The anneal may last between thirty minutes and four hours. The anneal may further release stress caused by the chemical reaction between the copper and the tin during the deposition process.

Subsequently, any remaining processing may be performed. For example, the semiconductor chip to which the bump or pillar is applied may be singulated from a wafer, if not performed previously. Also, the semiconductor chip may be soldered to a substrate or carrier using the pillar or bump, and underfill may be applied between the chip and carrier and around the pillar or bump. Different applications will have different processing steps, and the steps recited are merely exemplary.

Figure 2A:
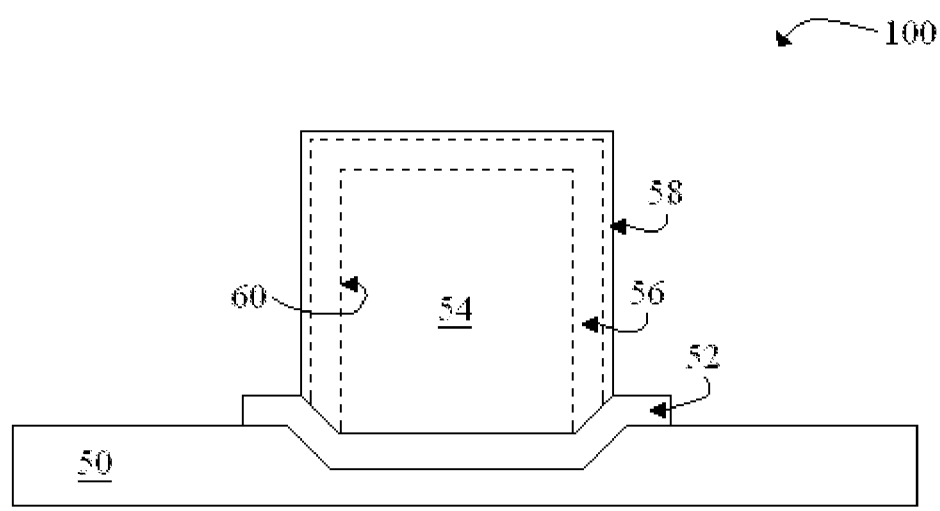
FIG. 2A is a portion of a semiconductor chip processed in accordance with an embodiment.

FIG. 2A is a portion 100 of a semiconductor chip 50 processed in accordance with an embodiment. The chip 50 comprises a pad 52 and a copper pillar 54. The copper pillar 54 is surrounded by a copper-tin compound 56 and a thin layer of unreacted tin 58. The unreacted tin 58 may be reacted with other materials in subsequent processing steps, as may be observed in a final chip or assembly. The copper-tin compound 56 and layer of tin 58 result from the dual thermal level deposition of tin onto the copper pillar 54 as discussed above. The thickness of the copper-tin compound 56 depends on the diffusion and reaction of the tin and the copper during processing. Voids may occur during processing at the copper-tin interface 60 between the copper in the copper pillar 54 and the copper-tin compound 56, but in embodiments, such voids will generally be 100 nanometers in width and smaller rather than up to 200 nanometers in width in the prior art.

Figure 2B:
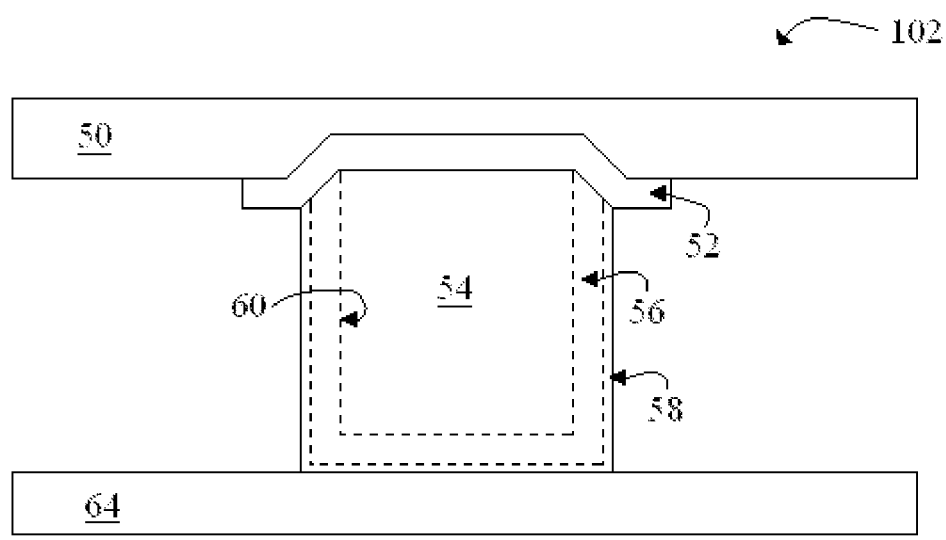
FIG. 2B is the semiconductor chip in a portion of a flip chip assembly in accordance with an embodiment.
Figure 2C:
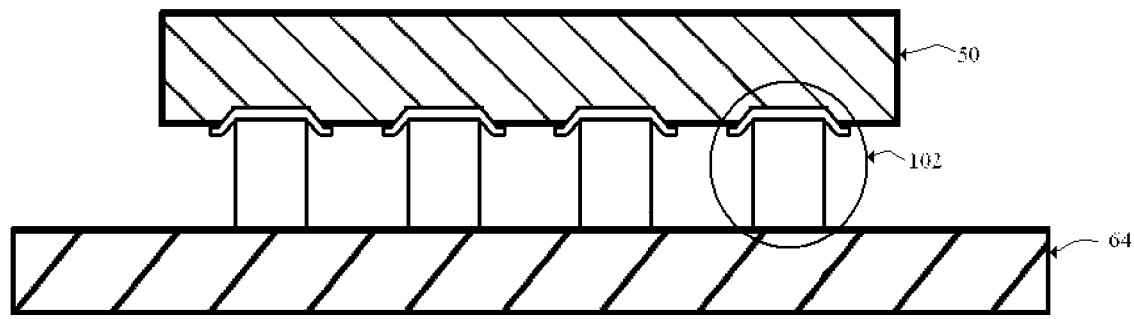
FIG. 2C is a flip chip assembly comprising the portion of the flip chip assembly in FIG. 2B.

FIG. 2B is the semiconductor chip 50 in a portion of a flip chip assembly 102 when the copper pillar is coupled to a package substrate 64. FIG. 2C is a flip chip assembly comprising the portion of the flip chip assembly 102 illustrated in FIG. 2B. The flip chip assembly in FIG. 2C comprises four portions 100, and the corresponding components illustrated in FIGS. 2A and 2B, although only one portion 100 is specifically enumerated. The number of portions 102 as illustrated is not intended to be limiting, but is only illustrative of an embodiment.

By following the process discussed above, the number and size of voids are reduced in the copper-tin interface on a pillar or bump. This may be accomplished first by removing copper oxide on the copper surface and wetting the copper surface during a pre-clean step. The pre-clean step removes irregularities caused by the copper oxide and prevents the presence of bubbles on the copper. The number and size of voids may be reduced by releasing stress at the copper-tin interface by using a thermal gradient deposition of tin onto the copper pillar. Further stress may be released by annealing the copper-tin compound. Although some voids may still occur by using this process, the number and width of voids decrease as compared to conventional processes and structures.

Although embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for forming a semiconductor assembly, the method comprising:
    cleaning a connector formed on a substrate, wherein the connector comprises copper;
    applying cold tin to the connector;
    after the step of the applying the cold tin, applying hot tin to the connector, wherein the hot tin is at a temperature greater than the cold tin, wherein the steps of applying cold tin and applying hot tin form a tin layer on the copper; and
    spin rinsing and drying the connector, an interface between the copper and the tin layer being substantially free of voids having widths greater than 100 nm.

2. The method of claim 1 further comprising micro-etching the connector.

3. The method of claim 2, wherein the micro-etching comprises using sodium persulfate, sulfuric acid, or combinations thereof.

4. The method of claim 1 further comprising annealing the connector.

5. The method of claim 1, wherein the cleaning further comprises immersing the connector in sulfuric acid ($H_2SO_4$).

6. The method of claim 1, wherein the applying the cold tin to the connector further comprises immersing a surface of the connector into a cold tin immersion.

7. The method of claim 1, wherein the applying the hot tin to the connector further comprises immersing a surface of the connector into a hot tin immersion.

8. The method of claim 1, wherein the connector is a copper bump and wherein the substrate is a semiconductor substrate.

9. The method of claim 1, wherein the cold tin is tin between about 20° C. and about 25° C.

10. The method of claim 1, wherein the hot tin is tin between about 40° C. and about 75° C.

11. The method of claim 1, wherein the cold tin and the hot tin each further comprise a reducing agent.

12. The method of claim 11, wherein the reducing agent comprises a thiourea mixture.

13. A method for forming a semiconductor assembly, the method comprising:
cleaning a surface of a copper connector;
immersing the surface of the copper connector into a thermal gradient of tin forming a copper-tin interface, wherein the thermal gradient of tin comprises a cold tin immersion and a subsequent hot tin immersion; and
spin rinsing and drying the copper connector, the copper-tin interface being substantially free of voids having widths greater than 100 nm.

14. The method of claim 13 further comprising micro-etching the surface of the copper connector.

15. The method of claim 13 further comprising annealing the copper connector.

16. The method of claim 15, wherein the annealing further comprises providing an environmental temperature in which the copper connector is located, the environmental temperature being between about 100° C. and about 250° C. for between about thirty minutes and about four hours.

17. The method of claim 13, wherein the cleaning further comprises immersing the surface of the copper connector in sulfuric acid ($H_2SO_4$).

18. The method of claim 13, wherein the cold tin immersion further comprises tin at a temperature of between about 20° C. and about 25° C.

19. The method of claim 13, wherein the hot tin immersion further comprises tin at a temperature of between about 40° C. and about 75° C.

20. The method of claim 13, wherein the thermal gradient of tin further comprises thiourea.

* * * * *